United States Patent [19]

Kamuro

[11] 4,309,629
[45] Jan. 5, 1982

[54] MOS TRANSISTOR DECODER CIRCUIT

[75] Inventor: Setsufumi Kamuro, Yamatokoriyama, Japan

[73] Assignee: Sharp Kabushiki Kaisha, Osaka, Japan

[21] Appl. No.: 69,085

[22] Filed: Aug. 23, 1979

[30] Foreign Application Priority Data

Aug. 25, 1978 [JP] Japan ............................. 53-104193

[51] Int. Cl.³ ................. H03K 19/094; H03K 19/20
[52] U.S. Cl. ........................................... 307/449; 307/463
[58] Field of Search ......... 307/205, 251, 270, DIG. 5, 307/449, 463, 584; 364/804, 347 DA

[56] References Cited

U.S. PATENT DOCUMENTS

| | | | |
|---|---|---|---|
| 3,665,473 | 5/1972 | Heimbigner | 307/DIG. 5 X |
| 3,778,784 | 12/1973 | Karp et al. | 307/DIG. 5 X |
| 3,806,880 | 4/1974 | Spence | 307/DIG. 5 X |
| 3,868,657 | 2/1975 | Hoffman et al. | 307/DIG. 5 X |
| 3,906,463 | 9/1975 | Yu | 307/DIG. 5 X |
| 3,909,808 | 9/1975 | Cochran et al. | 307/DIG. 5 X |
| 3,962,686 | 6/1976 | Matsue et al. | 307/DIG. 5 X |
| 4,024,512 | 5/1977 | Amelio | 307/DIG. 5 X |
| 4,094,012 | 6/1978 | Perlegos et al. | 307/DIG. 5 X |

OTHER PUBLICATIONS

Parikh, "High-Speed FET Decoder"; IBM Tech. Discl. Bull.; vol. 18, No. 12, pp. 3955-3956; 5/76.

*Primary Examiner*—Larry N. Anagnos
*Attorney, Agent, or Firm*—Birch, Stewart, Kolasch and Birch

[57] ABSTRACT

An MOS transistor decoder circuit including a plurality of MOS transistors and at least one load element, comprises at least one additional MOS transistor connected to the plurality of MOS transistors and the load element for selecting either of two output terminals for the plurality of MOS transistors, through which decoded output signals are developed. Preferably, four additional MOS transistor are provided at least two of which are connected to either of the two output terminals. The two additional MOS transistors connected to anyone of the two output terminals have normal and complement bit signals, respectively.

6 Claims, 1 Drawing Figure

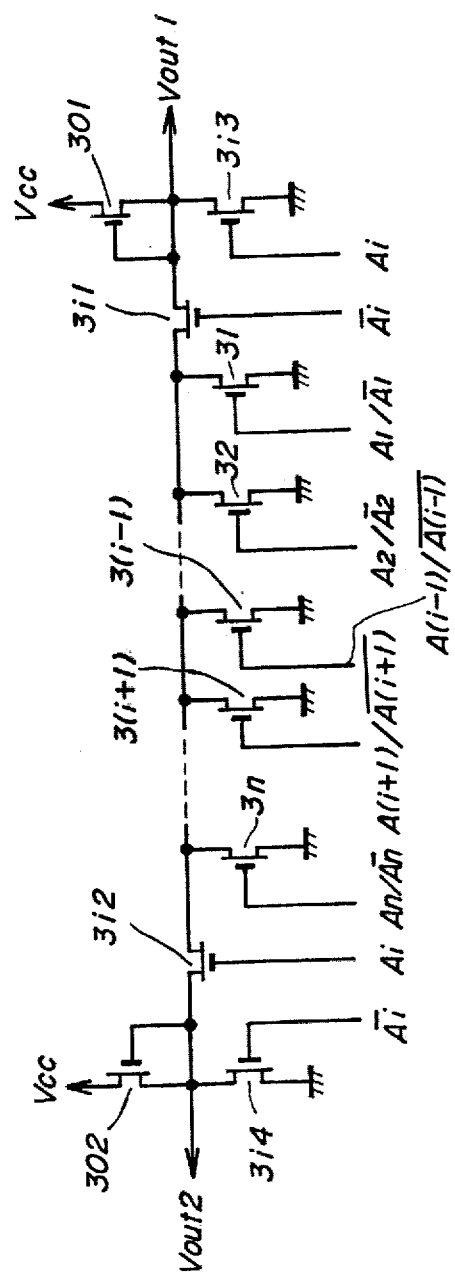

MOS TRANSISTOR DECODER CIRCUIT

BACKGROUND OF THE INVENTION

The present invention relates to a decoder circuit configuration and, more particularly, to an MOS transistor decoder circuit which is highly integrated.

There were conventionally two types of MOS transistor decoder circuits: the first of which comprises one load MOS transistor and a plurality of MOS transistors in series connected, gate terminals of which receive input signals for code transformation; and secondly, a decoder circuit comprising one load MOS transistor and a plurality of MOS transistors in parallel connected, the gate terminals of which receive also input signals for code transformation.

In either of the conventional MOS transistor decoder circuits, it was required that the number of the MOS transistors correspond to the number of input bits. The input bit signals were decoded to obtain a series of transferred output signals through an output terminal with the aid of the load MOS transistor. This led to defaults in that the conventional MOS transistor decoder circuits needed a considerably large area of semiconductor chips because of the necessity for a large number of the MOS transistors corresponding to the number of the bits.

SUMMARY OF THE INVENTION

Accordingly, it is an object of the present invention to provide an improved MOS transistor decoder circuit which is highly integrated.

It is another object of the present invention to provide an improved MOS transistor decoder circuit which obviates the need for a considerably large area of a semiconductor chip when the decoder circuit is composed within the semiconductor chip.

Other objects and further scope of applicability of the present invention will become apparent from the detailed description given hereinafter. It should be understood, however, that the detailed description and specific examples, indicating preferred embodiments of the invention, are given by way of illustration only, since various changes and modifications within the spirit and scope of the invention will become apparent to those skilled in the art from this detailed description.

To achieve the above objects, pursuant to an embodiment of the present invention, an MOS transistor decoder circuit including a plurality of MOS transistors and at least one load element, comprises at least one additional MOS transistor connected to the plurality of MOS transistors and the load element for selecting either of two output terminals for the plurality of MOS transistors, through which decoded output signals are developed.

Preferably, four additional MOS transistors are provided, at least two of which are connected to either of the two output terminals. The two additional MOS transistors connected to either of the two output terminals have normal and complement bit signals, respectively.

BRIEF DESCRIPTION OF THE DRAWING

The present invention will become more fully understood from the detailed description given hereinbelow and the accompanying drawing which is given by way of illustration only, and thus is not limitative of the present invention and wherein:

The single FIGURE of the drawing shows a circuit configuration of an MOS transistor decoder circuit according to the present invention.

DESCRIPTION OF THE INVENTION

The FIGURE of the drawing shows a circuit configuration of an MOS transistor decoder circuit according to the present invention. The MOS transistor decoder circuit comprises two load MOS transistors 301 and 302, a plurality of MOS transistors 31, 32 3(i−1), 3(i+1) .... 3n, and four output-selecting MOS transistors 3i1, 3i2, 3i3 and 3i4.

There are provided two output terminals Vout1 and Vout2 through one of which decoded output signals are developed under the control of "i" numbered bit signals Ai in response to input code signals A1 to An containing n bits. The two load MOS transistors 301 and 302 are respectively connected between the output terminals Vout1 and Vout2 and a power source terminal bearing a potential Vcc of a power source. These load elements need not be limited to MOS transistors 301 and 302. Other load members such as resistor elements composed of Poly-Crystalized silicon or depletion layer transistors are available as well.

A plurality of n bits signals $A1/\overline{A1}$ to $An/\overline{An}$ are applied to the MOS decoder circuit. While the (n−1) bit signals $A1/\overline{A1}$ to $A(i-1)/\overline{A(i-1)}$ and $A(i+1)/\overline{A(i+1)}$ to $An/\overline{An}$ are introduced into gate electrodes of the MOS transistors 31 to 3(i−1) and 3(i+1) to 3n, respectively, on the other hand, the "i" numbered bit signals $Ai/\overline{Ai}$ are admitted to the output-selecting MOS transistors 3i1 to 3i4 as will be discussed later.

The respective MOS transistors 31 to 3(i−1) and 3(i+1) to 3n have source electrodes connected to the ground and drain electrodes commonly connected to each other. In the other words, these MOS transistors are connected in parallel between the output terminals Vout1 and Vout2, so that they function to commonly provide the decoded output signals through one of the output terminals Vout1 and Vout2.

The output-selecting MOS transistors 3i1 to 3i4 are provided for selecting one of the output terminals Vout1 and Vout2, through which the decoded output signals are delivered, according to control under the logical conditions of the "i" numbered bit signals Ai. The source electrodes of the two output-selecting MOS transistors 3i1 and 3i2 are connected to each end of a common drain line for the drain electrodes of the MOS transistors 31 to 3(i−1) and 3(i+1) to 3n. The first output-selecting MOS transistor 3i1 has a gate electrode to which the complement of the "i" numbered bit signals $\overline{Ai}$ is applied while the second output-selecting MOS transistor 3i2 has a gate electrode to which the normal "i" numbered bit signals Ai are applied. The drain electrodes of the two output-selecting MOS transistors 3i1 and 3i2 provide the output terminals Vout1 and Vout2, respectively.

The third output-selecting MOS transistor 3i3 is connected between the first output terminal Vout1 and the ground. The normal "i" numbered bit signals Ai are admitted to the gate electrode of the third output-selecting MOS transistor 3i3. Similarly, the fourth output-selecting MOS transistor 3i4 is provided between the second output terminal Vout2 and the ground. The reversed "i" numbered bit signals $\overline{Ai}$ enter into the gate electrode of the fourth output-selecting MOS transistor 3i4.

In operation, only when all the MOS transistors 31 to 3(i−1) and 3(i+1) to 3n are placed in non-conductive states, the MOS transistor decoder circuit is enabled. The MOS transistors 31 to 3(i−1) and 3(i+1) to 3n receive the (n−1) bits signals as mentioned above. The logic states of the "i" numbered bit signals Ai and $\overline{Ai}$ entering to the respective output-selecting MOS transistors 3i1 to 3i4 select one of the two output terminals Vout1 and Vout2, through which the decoder output signals are generated.

For instance, if the normal "i" numbered bit signals Ai are at a low level, namely, the logic zero, the second and third output-selecting MOS transistors 3i2 and 3i3 are turned off. Simultaneously, on the other hand, the first and fourth output-selecting MOS transistors 3i1 and 3i4 are turned on. This results in the conditions that the first output terminal Vout1 is brought up to the potential Vcc of the power source and the second output terminal Vout2 is clamped to the ground, referred to as selecting the output terminal Vout1.

In contrast, if the normal "i" numbered bit signals Ai are at a high level, namely, the logic one, the states of all of the output-selecting MOS transistors 3i1 and 3i4 are changed to thereby select the output terminal Vout2. The first output terminal Vout1 is brought to the ground while the second output terminal Vout2 is raised to the potential Vcc.

When any of the MOS transistors 31 to 3(i−1) and 3(i+1) to 3n becomes conductive, the first and second output terminals Vout1 and Vout2 are connected to the ground irrespective of whether the normal "i" numbered bit signals Ai are at a high level or a low level. The MOS transisitors decoder circuit is not enabled at all.

The invention being thus described, it will be obvious that the same may be varied in many ways. Such variations are not to be regarded as a departure from the spirit and scope of the invention, and all such modifications are intended to be included within the scope of the following claims.

What is claimed is:

1. An MOS transistor decoder circuit for decoding codes formed of a plurality of input bits $A_I$-$A_n$ into two outputs Vout1, Vout2; said decoder circuit comprising:
   first and second output load elements for generating the outputs Vout1, Vout2, respectively;
   a plurality of bit receiving channels, the number of channels being one less than the total number of inputs, each bit receiving channel corresponding to an individual particular input $A_I$-$A_n$, each bit receiving channel producing a disable signal upon failure of its associated input to correspond to the value of its corresponding bit in a desired code;
   the one of said inputs $A_I$-$A_n$ not selected being an output selection input; and
   first and second output selecting channels responsive to said output selection input and its logical complement, respectively, for enabling said first and second load elements, respectively;
   said first and second load elements being driven only when enabled by said first and second output selecting channels and not disabled by any of said plurality of bit receiving channels, whereby said decoder functions to decode one of two different desired codes which differ by one binary bit to thereby produce one of said outputs Vout1, Vout2 when its corresponding desired code is introduced into said decoder circuit.

2. The transistor decoder circuit of claim 1 wherein each bit receiving channel includes a transistor shunt to ground, said corresponding particular input causing said transistor to conduct to produce a disable signal when said input is not an input bit of a desired code.

3. The transistor decoder circuit of claim 2 wherein said first and second output selecting channels each comprise first and second transistors, said first transistor connecting said plurality of bits receiving channels to its respective output load element when selected, said second transistor shunting its respective output load element when not selected.

4. The transistor decoder circuit of claim 3 wherein said output load elements are MOS transistors.

5. The transistor decoder circuit of claim 3 wherein said output load elements are depletion layer transistors.

6. The transistor decoder circuit of claim 3 wherein said output load elements are formed of polycrystalized silicon.

* * * * *